United States Patent
Klostermann

(10) Patent No.: US 7,602,637 B2
(45) Date of Patent: Oct. 13, 2009

(54) INTEGRATED CIRCUITS; METHODS FOR OPERATING AN INTEGRATING CIRCUIT; MEMORY MODULES

(75) Inventor: Ulrich Klostermann, Munich (DE)

(73) Assignees: Qimonda AG, Munich (DE); Altis Semiconductor, SNC, Corbeil Essonnes Cedex (FR)

( * ) Notice: Subject to any disclaimer, the term of this patent is extended or adjusted under 35 U.S.C. 154(b) by 220 days.

(21) Appl. No.: 11/856,643

(22) Filed: Sep. 17, 2007

(65) Prior Publication Data

US 2009/0073748 A1 Mar. 19, 2009

(51) Int. Cl.
*G11C 11/00* (2006.01)
(52) U.S. Cl. ............................ 365/171; 365/158
(58) Field of Classification Search ............... 365/171, 365/158, 157
See application file for complete search history.

(56) References Cited

U.S. PATENT DOCUMENTS

2007/0297222 A1* 12/2007 Leuschner ............... 365/171

\* cited by examiner

*Primary Examiner*—Vu A Le
(74) *Attorney, Agent, or Firm*—Slater & Matsil, L.L.P.

(57) ABSTRACT

Embodiments of the invention relate generally to integrated circuits, to methods for operating an integrating circuit, and to memory modules. In an embodiment of the invention, an integrated circuit having a magnetic random access memory cell is provided. The magnetic random access memory cell may include a reference layer structure being polarized in a first direction, a free layer structure including at least two anti-parallel coupled ferromagnetic layers and having an anisotropy in an axis parallel to the first direction, at least one of the at least two anti-parallel coupled ferromagnetic layers being made of a material having a temperature dependent saturation magnetization moment, and a non-magnetic tunnel barrier layer structure being disposed between the reference layer structure and the free layer structure.

25 Claims, 6 Drawing Sheets

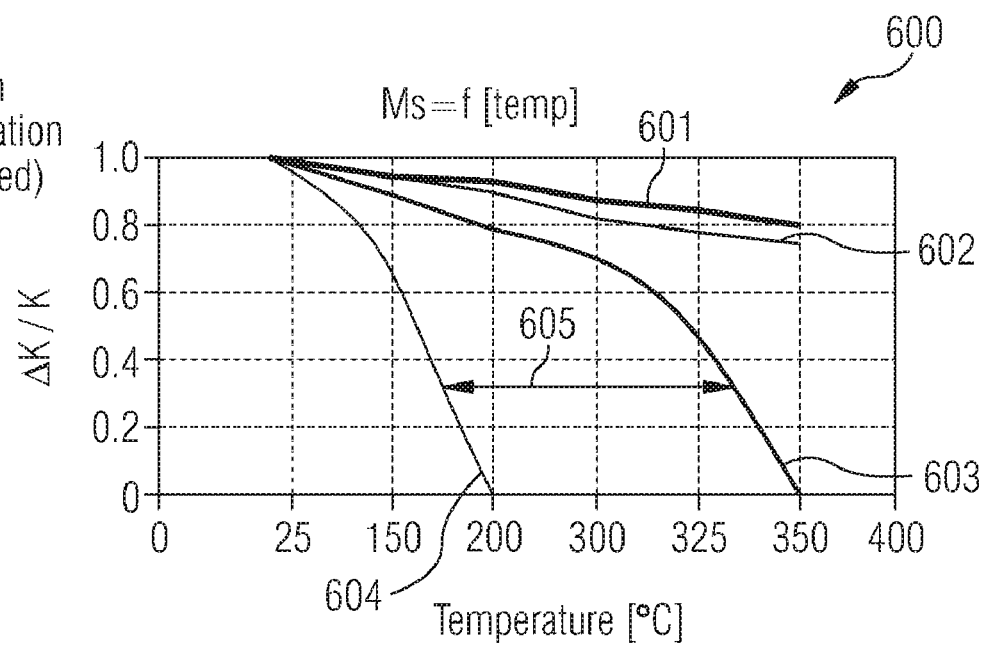

INTEGRATED CIRCUITS; METHODS FOR OPERATING AN INTEGRATING CIRCUIT; MEMORY MODULES

TECHNICAL FIELD

Embodiments of the invention relate generally to integrated circuits, to methods for operating an integrating circuit, and to memory modules.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a diagram showing the saturation magnetization moment of a low moment material (CoFeB-based) in dependency of the temperature.

DETAILED DESCRIPTION OF ILLUSTRATIVE EMBODIMENTS

Magnetic random access memory (MRAM) devices are emerging as possible replacements for conventional RAM memory structures such as dynamic and static RAM structures. MRAM devices exhibit similar access speeds and greater immunity to radiation compared to conventional DRAM and SRAM structures, and advantageously do not require applied power to retain their logical state.

Figure 1:
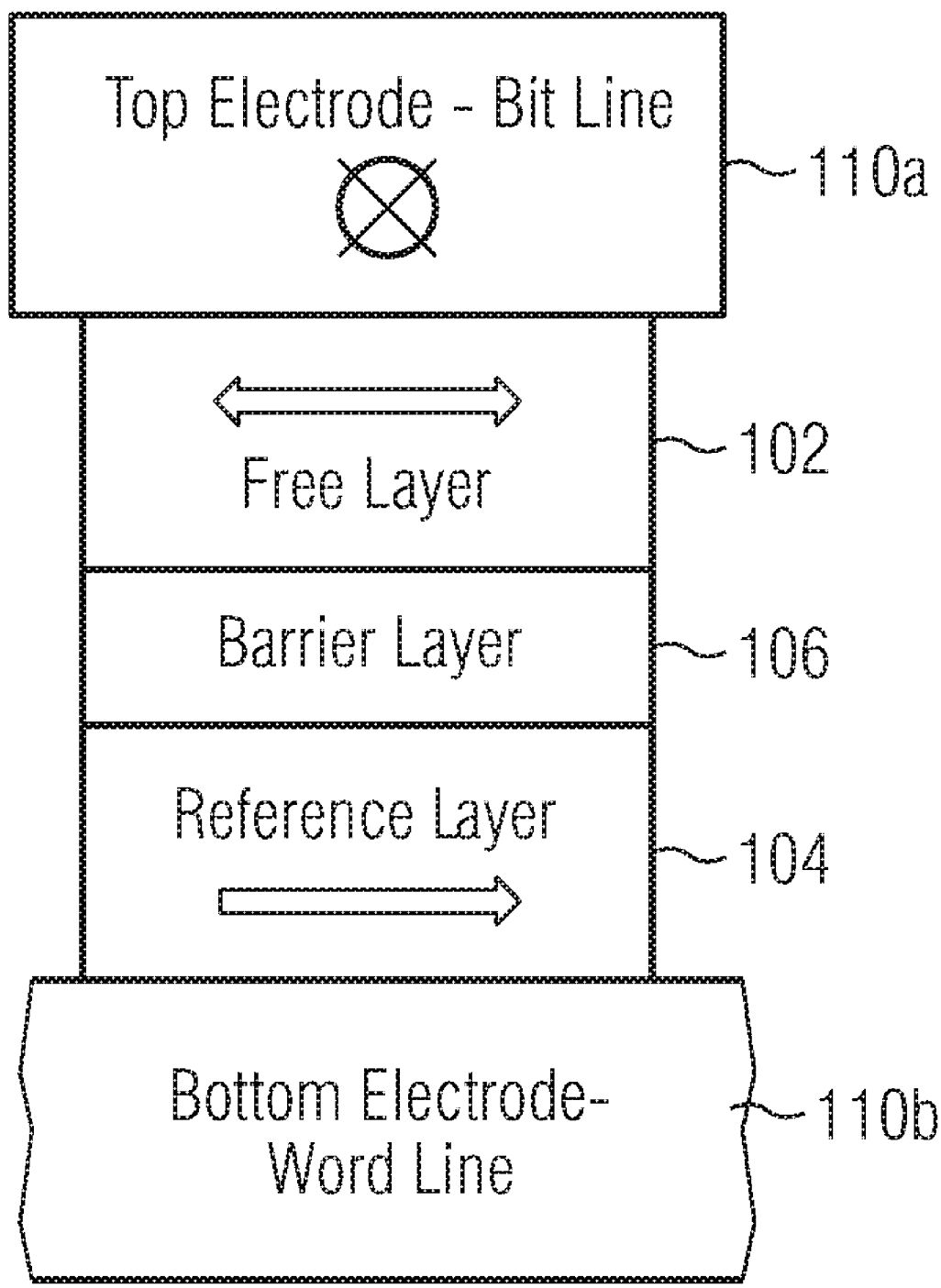
FIG. 1 shows a conventional MRAM cell structure of a none toggle mode type.

FIG. 1 illustrates a basic block diagram of a conventional MRAM cell structure. The MRAM cell structure generally includes a so called free layer 102, a reference layer 104, and a barrier junction 106 there between. The free layer 102 and the reference layer 104 are formed from materials which own a particular magnetic orientation, the relative orientations of which are either parallel, in which case the MRAM cell has a relatively low tunnel magneto resistance or anti-parallel in which case the MRAM cell has a relatively high tunnel magneto resistance.

The free layer 102 will typically consist of a material which has a lower magnetic coercivity, and therefore the free layer can become more easily re-oriented, compared to the reference layer 104 which is supposed to keep its magnetic polarization. Reading the state of the MRAM cell is performed by passing a predefined current through the free layer, the barrier layer and the reference layer, i.e. basically between the top and bottom electrodes 110a and 110b, and monitoring the resulting voltage.

Besides the more common MRAM cell type that allows direct programming i.e. writing of a binary information '0' or '1' into a memory cell, another cell type is known as 'toggle mode' MRAM cell, that uses a different programming procedure. The toggle mode MRAM programming procedure basically provides only the function to alter (toggle) the contents, i.e. a binary '0' into '1' or a binary '1' into '0', of a memory cell. Therefore, a read operation of the memory cell has to go ahead and determine whether the binary information intended to be written is already stored or requires altering of the currently stored binary information.

The structure of a toggle mode MRAM cell is similar to that of a conventional MRAM cell type except that the free layer 102 of a toggle mode MRAM cell consists of two anti-parallel coupled ferromagnetic layers that have an easy axis that lies in an angle of about 45 degrees to a top electrode and a bottom electrode, whereby the top electrode and bottom electrode extend perpendicular to each other.

Programming (i.e. toggling) of a toggle mode MRAM cell is performed by applying a bit line electrode field current and a word line electrode field current unidirectional via the top electrode (e.g. bit line electrode) and the bottom electrode (e.g. word line electrode) to a particular MRAM memory cell located at the top electrode and bottom electrode intersection. The field currents are applied at a sufficient magnitude to generate a magnetic field that turns the magnetic orientation of the free layer into its opposite direction (i.e. 180 degrees) respectively, whereby a generation of the magnetic field for toggling the magnetic orientation (also called adiabatic rotation) of the free layer contains three steps.

Figure 2:
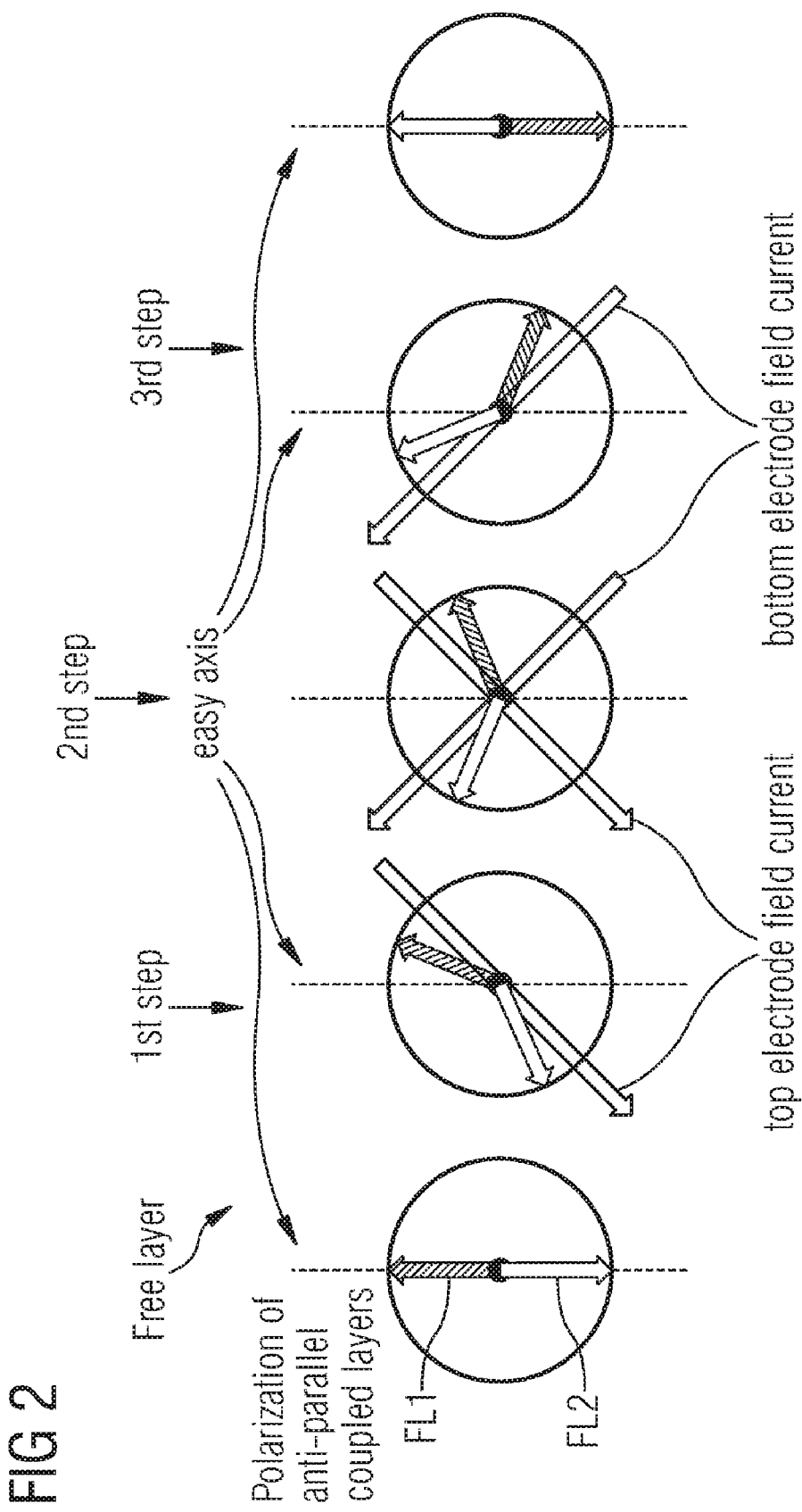
FIG. 2 shows the magnetic orientation of the two anti-parallel coupled ferromagnetic layers of a free layer in a conventional toggle mode MRAM cell during programming.

FIG. 2 illustrates the magnetic orientation of the two anti-parallel coupled ferromagnetic layers FL1, FL2 of a free layer in a conventional toggle mode MRAM cell in the three steps during programming. A first step where only a first field current, e.g. the bit line electrode field current, is applied, a second step where an other field current, e.g. the word line electrode field current is additionally applied and a third step where the first field current is switched off while the other field current remains on. The polarization of the two anti-parallel coupled ferromagnetic layers FL1, FL2 rotate slightly in the direction of the applied magnetic field and essentially follow the applied field that rotates with the currents pulsed through the top electrode and bottom electrode in the sequence of the three steps. At the end of the sequence the polarization of the two anti-parallel coupled ferromagnetic layer has rotated 180 degrees from an initial state, regardless of the initial state. The applied magnetic fields should be higher than a minimum critical magnetic field and lower than another critical magnetic field for ensuring the toggling mechanism.

As a difference to a conventional MRAM cell, the toggle mode MRAM cell is highly insensitive to so called half select disturbs, even when a relatively strong magnetic field is involved. Since the free layer has no net magnetic moment, the field experienced by an individual memory cell is insensitive to the state of a neighboring memory cell. This is an important advantage of the toggle mode MRAM cell when cell size and distance to neighboring memory cells need to be reduced to reduce chip size.

However scaling down of the size of a toggle mode MRAM cell requires an increase of the free layer thickness to maintain information stability requirements and as a consequence this leads to a very strong magnetic coupling between the two anti-parallel coupled ferromagnetic layers FL1, FL2. This strong magnetic coupling in turn requires strong magnetic fields for programming which have to be generated by high drive levels of the field currents through the top and bottom electrodes, resulting in high power dissipation levels, a reduced number of cells per electrode and the requirement of large drive gate periphery transistors.

To circumvent above mentioned issues an application of a thermal select scheme used in conjunction with conventional MRAM cell types was thought of. In that case an anti-ferromagnetic layer coupled to the free layer on its side opposite to the barrier layer would be used to make the magnetic coercivity of the free layer dependent on the temperature of the anti-ferromagnetic layer. With an attached anti-ferromagnetic layer the free layer would namely exhibit on the one hand a relatively high magnetic coercivity with the anti-ferromagnet being active, i.e. below its blocking temperature, e.g. at room temperature. On the other hand the free layer would exhibit a very low coercivity (almost none) with the anti-ferromagnet being inactive, i.e. above its blocking temperature. This influencing effect of an anti-ferromagnet upon a ferromagnet is also called pinning. For a thermal select of a memory cell therefore the anti-ferromagnetic layer has to be heated before and during altering of the polarization of the attached free layer by the magnetic field generated by the top and bottom electrodes.

Furthermore, high heating currents would be required hindering the scaling down due to large select transistors. Furthermore, conventional thermal select schemes which rely on the heating of antiferromagnets such as IrMn or PtMn, etc., have a large distribution of its blocking temperature which negatively affects the distribution of the necessary heating currents.

Since the toggling mode MRAM cell is highly interesting due to its conceptual nature to be used in high density MRAM devices, there are serious requests for a solution that leaves the interesting basic attitudes of a toggle mode MRAM cell largely unchanged but circumvents obstacles hindering from scaling down.

Figure 3:
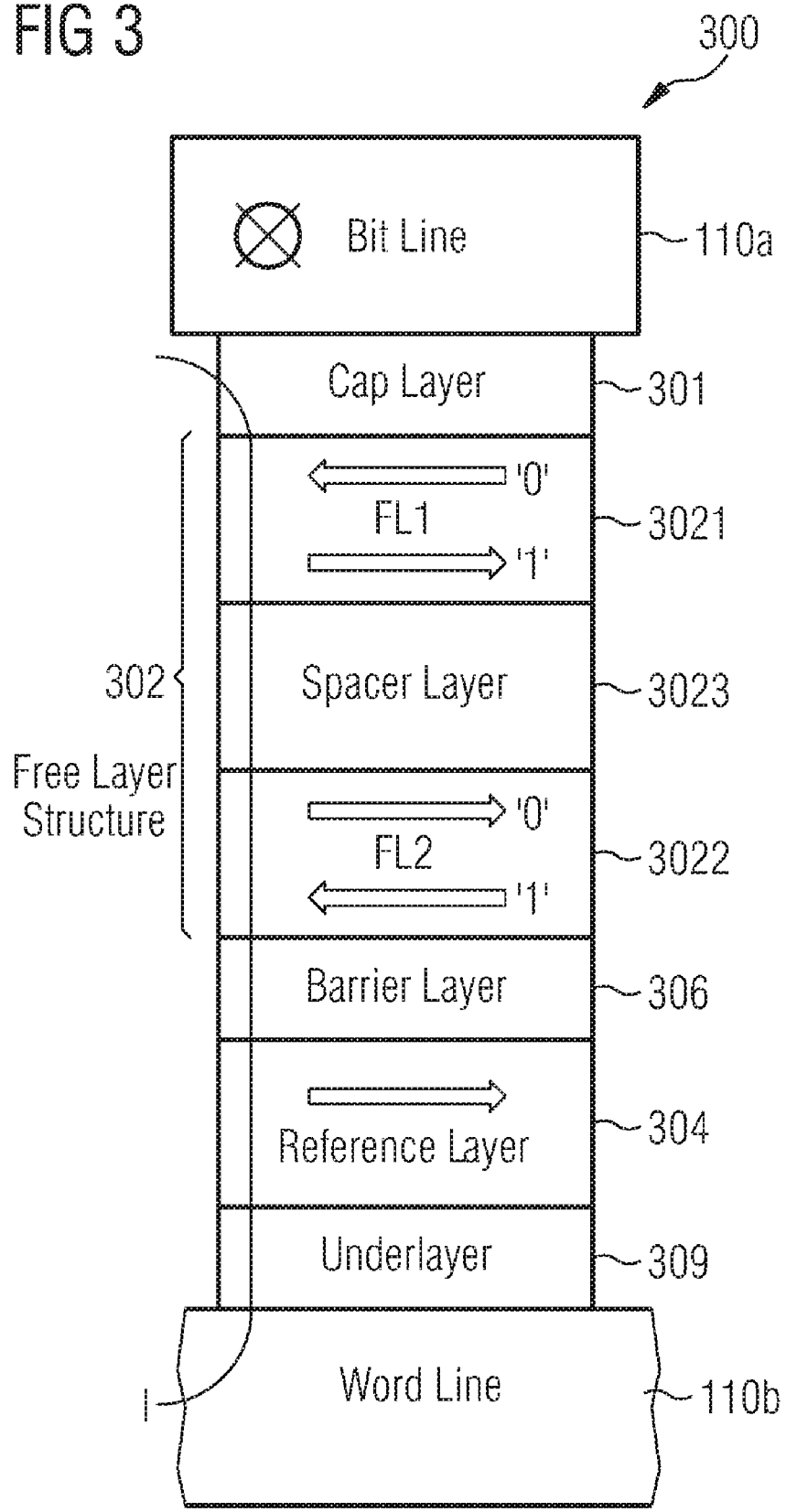
FIG. 3 shows an exemplary toggle mode MRAM cell structure in accordance with the present invention.

FIG. 3 illustrates an exemplary toggle mode MRAM cell structure 300 in accordance with an exemplary embodiment of the present invention.

The exemplary toggle mode MRAM cell structure 300 has a free layer structure 302, a reference layer structure 304 and a barrier layer structure 306, which is disposed between the free layer structure 302 and the reference layer structure 304. Opposite to the barrier layer structure 306 the free layer structure 302 is coupled to a cap layer 301 and the reference layer structure 304 is coupled to an underlayer 309. A top electrode which is in the exemplary shown embodiment called bit line 110a is coupled to the cap layer 301 and a bottom electrode which is in the exemplary shown embodiment called word line 110b is located adjacent to the underlayer 309. The bit line 110a and the word line 110b are perpendicular to each other, whereas in the particular embodiment shown the bit line 110a has a longitudinal plan into and out of the drawing and the word line 110b has a longitudinal plan in the plan of the drawing.

The free layer structure 302 is composed of an upper and a lower anti-parallel coupled ferromagnetic layer 3021, 3022, whereby the lower ferromagnetic layer 3022 is neighboring to the barrier layer structure 306. The two anti-parallel coupled ferromagnetic layers 3021, 3022 are having a magnetic polarization that can be altered in the presence of a magnetic field generated by field currents through the bit line or word line 110a, 110b. In one embodiment shown, a spacer layer 3023 is disposed between the two anti-parallel coupled ferromagnetic layers 3021, 3022. Although in the exemplary embodiment the free layer structure 302 contains one pair of anti-parallel coupled ferromagnetic layers 3021, 3022, which is also called a coupled sandwich; a free layer structure 302 is basically not limited to have only one coupled sandwich. It should be noted that in an alternative embodiment of the invention, the free layer structure 302 may include two free layers being separated from each other by means of a barrier layer.

In a particular embodiment the ferromagnetic layers 3021, 3022 have a thickness of about 30 nm each and are construed as a round element with a diameter of about 90 nm. In an exemplary embodiment the ferromagnetic layers 3021, 3022 are made of a material containing boron B, cobalt Co, iron Fe, nickel Ni and silicon Si with a percentage of 1 to 5 for boron and nickel, respectively, of 7 to 13 for iron and silicon respectively and of 75 to 90 for cobalt.

In an alternative embodiment of the invention, the top electrode 110a and the bottom electrode 110b may be separated from the field generating lines. In yet another embodiment of the invention, the bottom electrode may be coupled to a switching transistor, which may be controlled via a respective word line being coupled to the control terminal (e.g. the gate terminal in case of a field effect transistor).

In another exemplary embodiment the ferromagnetic layers 3021, 3022 are made of $(CoFeMo)_{73}(SiB)_{27}$ or $(Ni,Fe)_{78}(Si,B,C)_{22}$ or $Tb_{20}Fe_{80}$.

According to the nature of anti-parallel coupling, the ferromagnetic layers 3021, 3022 have magnetic polarizations that are oriented in opposite directions. A magnetic moment of one of the two ferromagnetic layers 3021, 3022 is compensated by the magnetic moment of the other one. Therewith, the sandwich and as a consequence the free layer structure has no net magnetic moment.

The free layer structure 302 has an easy axis, which has an orientation of 45 degrees to the bit line and to the word line (see FIG. 2). The easy axis is a magnetic preference axis. In the exemplary embodiment the easy axis is solely defined by an uniaxial anisotropy provided by the material of the ferromagnetic layers. That kind of a material caused anisotropy is also called intrinsic anisotropy.

The spacer layer 3023 in a particular embodiment is made of ruthenium Ru, copper (Cu), tantalum (Ta), aluminum (Al), rhodium (Rh), rhenium (Re), copper nitride, tantalum nitride and may have a layer thickness in the range of about 8 Angstroms to about 50 Angstroms.

The reference layer structure 304 a fixed magnetic orientation in one direction parallel to the easy axis of the free layer structure 302. The reference layer structure 304 may be composed of one, as in the exemplary embodiment, or more layers and its magnetic orientation will not be altered by a magnetic field generated by field currents through the bit line or word line 110a, 110b.

In a particular embodiment the reference layer structure 304 is made of a ferromagnetic material such as PtMn (having a thickness e.g. in the range of about 100 Angstroms to about 200 Angstroms)/CoFe (having a thickness e.g. in the range of about 15 Angstroms to about 25 Angstroms)/Ru (having a thickness e.g. of about 8 Angstroms)/CoFe (having a thickness e.g. in the range of about 15 Angstroms to about 25 Angstroms).

The barrier layer structure 306 is disposed between the free layer structure 302 and the reference layer structure 304, i.e. in the exemplary embodiments previously described, between the lower anti-parallel coupled ferromagnetic layer 3022 of the free layer structure 302 and the reference layer structure 304. The barrier layer structure 306 is a magnetic tunneling junction (MTJ) of the toggle mode MRAM cell

300. In the exemplary shown embodiment the barrier layer structure 306 consists of one barrier layer, whereby in an exemplary embodiment the barrier layer 306 is made of magnesia (MgO) and in a particular embodiment it has a thickness of about 6 Angstroms.

In a particular embodiment, the free layer structure 302, the barrier layer structure 306 and the reference layer structure 304 which together form a layer stack are based on an underlayer 309 which represents a bottom layer of the layer stack. The underlayer 309 can be also understood as a seed layer for the reference layer structure 304 during manufacturing. Furthermore the underlayer 309 may be used to provide electrical contact to a lower level wiring, e.g. to the word line 110b.

In an exemplary embodiment, a cap layer 301 is formed on top of the layer stack, e.g. on top of the upper anti-parallel coupled ferromagnetic layer 3021, to protect the magnetic materials from exposure to the ambient. The cap layer 301 may also be used to provide electrical contact to an upper level wiring, e.g. to a read current switching transistor.

The underlayer 309 and the cap layer 301 both are typically formed from a conductive material such as tantalum (Ta), tantalum nitride (TaN), titanium (Ti) or titanium nitride (TiN). In an exemplary embodiment the cap layer 301 is made of tantalum nitride (TaN) and has a thickness of 100 Angstroms. The underlayer 309 for example may be a double layer composed of a tantalum nitride (TaN) layer with a thickness of approximately 100 Angstroms and a tantalum (Ta) layer with a thickness of approximately 20 Angstroms.

Those skilled in the art will recognize that the order of the layer stack may be reversed. That is, the reference layer structure 304 may be on top of the stack and the free layer structure 302 may be underneath the barrier layer structure 306.

A current path 1 is provided between the word line 110b, through the underlayer 309, the reference layer structure 304, the barrier layer structure 306, the free layer structure 302 and the cap layer 301. The current path 1 being operable in conducting a read current via a read current switching transistor connected to the underlayer 309 for determining the state of the toggle mode MRAM cell 300.

Although in the exemplary embodiment the current path 1 is fed through the whole stack, in a particular embodiment the current path could be fed only from the word line 110b through the underlayer 309, the reference layer structure 304, the barrier layer structure 306, the lower anti-parallel coupled ferromagnetic layer 3022 and exit the stack via the spacer layer 3023. This embodiment would circumvent an influence of a possible second magnetic tunnel junction created by the two anti-parallel ferromagnetic layers 3021, 3022 and the spacer layer 3023 disposed between.

Since programming of the toggle mode MRAM cell 300 according to one embodiment of the present invention includes a reduction of the toggle field of the free layer structure 302 by heating the free layer structure 302, certain measures are provided for heating purposes. Heating can be caused for example by a current through the barrier layer structure 306, whereby the heat is generated by the resistive tunnel barrier; or the spacer layer 3023, whereby the heat is generated by a lamination or a high resistive material; by an additional heating layer; by a heating wall around the stack, etc.

Programming of a toggle mode MRAM cell 300 means altering the polarization of the free layer structure 302. This is done by pre-selecting the toggle mode MRAM cell 300 by means of heating the free layer structure 302 of a selected toggle mode MRAM cell 300 up to a certain temperature and then toggle the magnetic polarization. The temperature has to be only high enough for the material used for both or only one of the anti-parallel coupled ferromagnetic layers 3021, 3022 to bring the toggle field strength of the free layer structure 302 below a given limit. Below that limit the magnetic field generated by restrained field currents through the bit and word lines 110a, 10b will be high enough to toggle the magnetic orientations of the anti-parallel coupled ferromagnetic layers 3021, 3022.

In contrast to conventional thermal select schemes switching selection in a toggle mode MRAM cell according to an embodiment of the invention does not only rely on heating currents. Therefore, scaling issues of select transistors is not so critical anymore. A toggle mode MRAM cell according to the invention furthermore provides a better selectivity compared to conventional MRAM cells that use only thermal select. The better selectivity is based on the very selective toggling mode.

Another effect of a toggle mode MRAM cell according to one embodiment of the invention is, that less heating currents will be required than a conventional MRAM cells with thermal select scheme, because not all of the saturation magnetization or intrinsic anisotropy has to vanish. Saturation magnetization or/and intrinsic anisotropy have to be reduced only sufficiently to bring the toggle field below a given limit. Furthermore, an effect of a toggle mode MRAM cell according to one embodiment of the invention is that less heating currents result in less stressing of the barrier layer structure, what increases reliability of the barrier layer structure.

A further effect of a toggle mode MRAM cell according to one embodiment of the invention can be seen in the fact that there is no need for an assisting field during cool down, which besides others accelerates access time of the memory cell.

How the toggling works has been already described above in connection with FIG. 2. Within three processes, where subsequently the bit line 110a, then additionally the word line 110b and then only the word line 110b generate a magnetic field that turns the magnetic orientation of both anti-parallel coupled ferromagnetic layers 3021, 3022 by 180 degrees.

Since a toggle mode MRAM cell according to one embodiment of the invention requires a material that can be used for one or both of the anti-parallel coupled ferromagnetic layers 3021, 3022 and that has to provide a temperature dependency on the toggle field strength, it was an issue which material related parameter alone or together with other parameters influences the toggle field strength, and which material can be found as temperature dependent and if so, which material can provide that attributes.

As a result, the finding was that the saturation magnetization moment Ms and the intrinsic anisotropy field strength Hk can be found temperature dependent and influence the toggle field strength Hsf. Therefore the material used for an anti-parallel coupled ferromagnetic layer has a temperature dependency on the saturation magnetization moment Ms or on the intrinsic anisotropy field strength Hk. In a particular embodiment the material has both dependencies.

Figure 4:
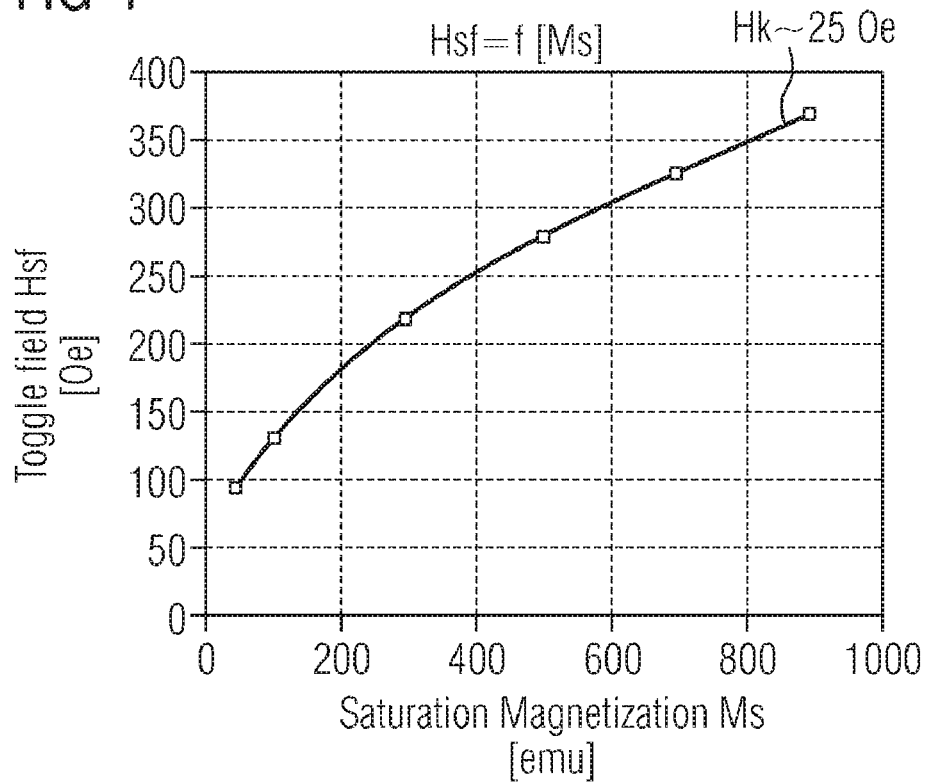
FIG. 4 shows a diagram showing the toggle field strength of a free layer structure in dependency of the saturation magnetization moment.

FIG. 4 illustrates a diagram that shows for an exemplary situation a material having a dependency of the toggle field strength Hsf on the saturation magnetization moment Ms. The exemplary situation relates to a 90 nm diameter cell with a thickness of 30 nm of each of the two anti-parallel coupled ferromagnetic layers; furthermore an intrinsic anisotropy field of approximately 25 Oe is given. As can be seen in FIG. 4, the toggle field strength Hsf increases from about 100 Oe to about 370 Oe with the saturation magnetization moment increasing from about 50 emu to 900 emu.

Figure 5:
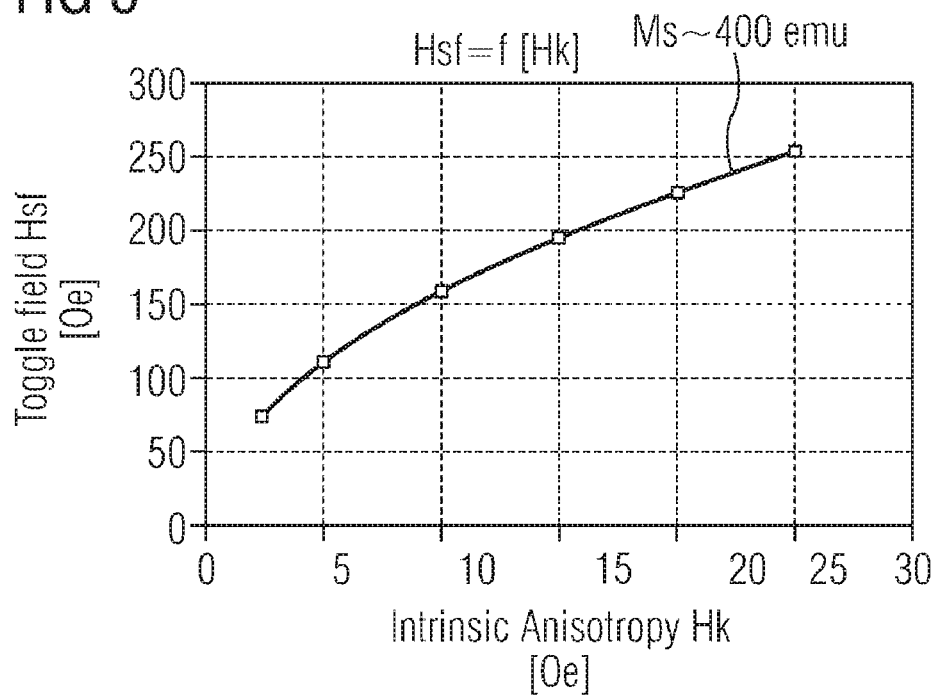
FIG. 5 shows a diagram showing the toggle field strength of a free layer structure in dependency of the intrinsic anisotropy field.

FIG. 5 illustrates a diagram that shows for an exemplary situation and material having a dependency of the toggle field strength Hsf on the intrinsic anisotropy field strength Hk. The exemplary situation relates also to a 90 nm diameter cell with a thickness of 30 nm of each of the two anti-parallel coupled ferromagnetic layers; furthermore a saturation magnetization moment of approximately 400 emu is given. As can be seen in FIG. 5, the toggle field strength Hsf increases from about 80 Oe to about 250 Oe with the intrinsic anisotropy field strength Hk increasing from about 2 to 25 Oe.

FIG. 6 illustrates a diagram 600 that shows various low Tc materials with different material compositions.

The diagram shows four graphs related to an amorphous material, e.g. (B (e.g. about 1% to about 5%) Co (e.g. about 75% to about 90%) Fe (e.g. about 7% to about 13%))$_{1-x}$Fe$_x$ with different amounts of co-sputtered additional Fe.

The upper two graphs (a first graph 601 and a second graph 602) (relating to the above materials with co-sputtered additional Fe of more than about 25%) show almost linear dependence with a decreasing normalized saturation magnification Ms norm from 1.0 to approx. 0.8 with an increasing temperature from 25 degrees Celsius to 350 degrees Celsius. The lower two graphs (a third graph 603 and a fourth graph 604) show non linear runs with a rapidly decreasing normalized saturation magnification Ms norm above 150 degrees Celsius, wherein the third graph 603 relates to the above materials with co-sputtered additional Fe of more than about 1% and the fourth graph 604 relates to the above materials with co-sputtered additional Fe of approximately 0%. The lowest graph (i.e. the fourth graph 604) shown reaches the zero point of the normalized saturation magnification M norm at approx. 200 degrees Celsius whereby the upper of the two lower reaches the zero point at 350 degrees Celsius. The desired region lies between the third graph 603 and the fourth graph 604 and is denoted with the reference number 605.

Since one embodiment of the present invention uses heating only to slightly reduce the toggling field in strength so far that the magnetic field applied during programming can alter the polarization of the free layer structure, therefore a material having an almost constant Ms around the operating temperature (about 0° C. to about 80° C.) and a strong onset of Ms reduction above the operating temperature. A possible range is indicated by the two lower graphs in FIG. 6 and symbolized by a reference number 602. For programming purposes according to one embodiment of the present invention, toggling field strength should not go below a minimum value because the adiabatic rotation requires a certain toggling field strength, below which minimum value toggling would not work.

Figure 7A:
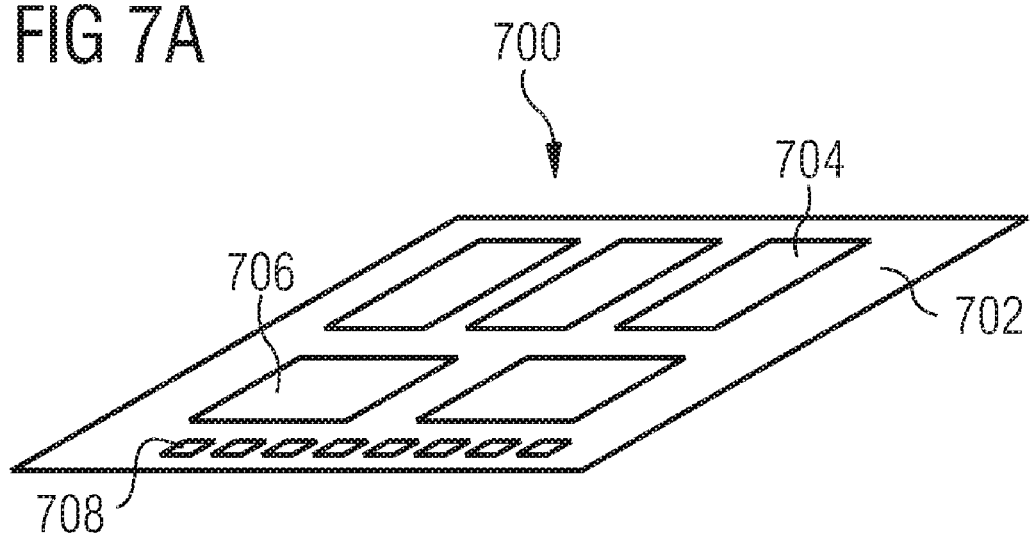
FIGS. 7A and 7B show a memory module (FIG. 7A) and a stackable memory module (FIG. 7B) in accordance with an embodiment of the invention.
Figure 7B:
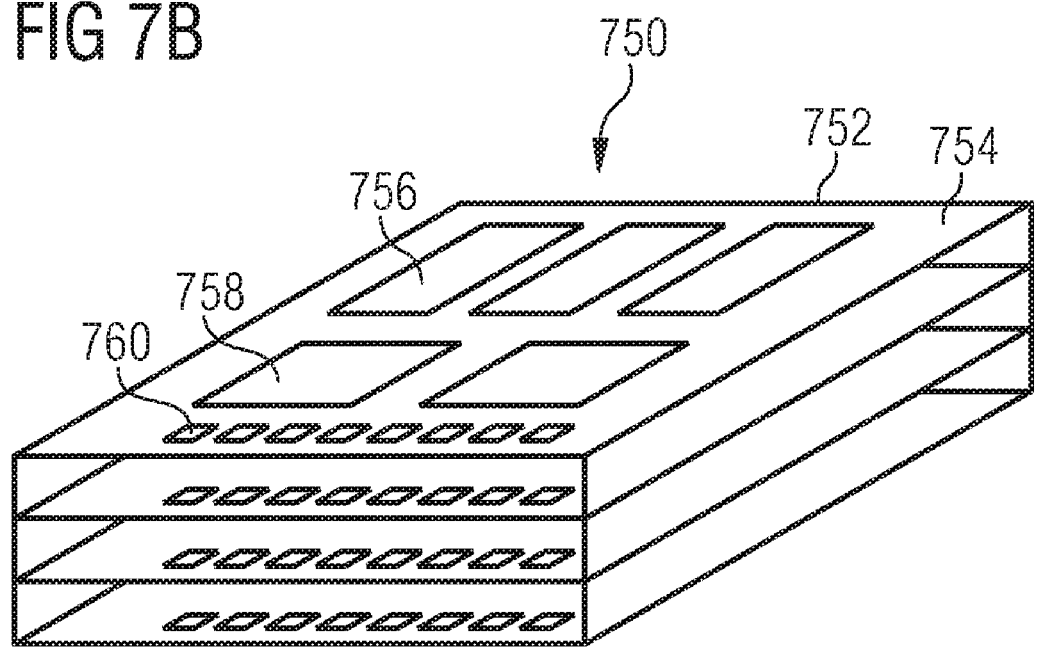

As shown in FIGS. 7A and 7B, in some embodiments, memory devices such as those described herein may be used in modules.

In FIG. 7A, a memory module 700 is shown, on which one or more memory devices 704 are arranged on a substrate 702. The memory device 704 may include numerous memory cells, each of which uses a memory element in accordance with an embodiment of the invention. The memory module 700 may also include one or more electronic devices 706, which may include memory, processing circuitry, control circuitry, addressing circuitry, bus interconnection circuitry, or other circuitry or electronic devices that may be combined on a module with a memory device, such as the memory device 704. Additionally, the memory module 700 includes multiple electrical connections 708, which may be used to connect the memory module 700 to other electronic components, including other modules.

As shown in FIG. 7B, in some embodiments, these modules may be stackable, to form a stack 750. For example, a stackable memory module 752 may contain one or more memory devices 756, arranged on a stackable substrate 754. The memory device 756 contains memory cells that employ memory elements in accordance with an embodiment of the invention. The stackable memory module 752 may also include one or more electronic devices 758, which may include memory, processing circuitry, control circuitry, addressing circuitry, bus interconnection circuitry, or other circuitry or electronic devices that may be combined on a module with a memory device, such as the memory device 756. Electrical connections 760 are used to connect the stackable memory module 752 with other modules in the stack 750, or with other electronic devices. Other modules in the stack 750 may include additional stackable memory modules, similar to the stackable memory module 752 described above, or other types of stackable modules, such as stackable processing modules, control modules, communication modules, or other modules containing electronic components.

In an embodiment of the invention, an integrated circuit having a magnetic random access memory cell (e.g. a toggle mode magnetic random access memory cell) is provided. The magnetic random access memory cell may include a reference layer structure being polarized in a first direction, a free layer structure including at least two anti-parallel coupled ferromagnetic layers and having an anisotropy in an axis parallel to the first direction, at least one of the at least two anti-parallel coupled ferromagnetic layers being made of a material having a temperature dependent saturation magnetization moment, and a non-magnetic tunnel barrier layer structure being disposed between the reference layer structure and the free layer structure.

In another embodiment of the invention, an integrated circuit having a magnetic random access memory cell (e.g. a toggle mode magnetic random access memory cell) is provided. The magnetic random access memory cell may include a reference layer structure being polarized in a first direction, a free layer structure including at least two anti-parallel coupled ferromagnetic layers and having an anisotropy in an axis parallel to the first direction; at least one of the at least two anti-parallel coupled ferromagnetic layers being made of a material having a temperature dependent intrinsic anisotropy field, and a non-magnetic tunnel barrier layer structure being disposed between the reference layer structure and the free layer structure.

The non-magnetic tunnel barrier layer structure may be a part of a current path to generate heat.

A non-magnetic spacer layer may be provided which may be arranged between the at least two anti-parallel coupled ferromagnetic layers and being a part of a current path to generate heat.

In an embodiment of the invention, the material has a relatively low Curie temperature.

Furthermore, the material may be made of at least one material being selected from a group of materials consisting of boron, cobalt, iron, nickel, silicon, molybdenum, terbium, copper, platinum.

The boron may have a percentage in a range from about 1 to about 5.

The cobalt may have a percentage in a range from about 75 to about 90.

The iron may have a percentage in a range from about 7 to about 30.

The nickel may have a percentage in a range from about 1 to about 5.

The silicon may have a percentage in a range from about 7 to about 13.

In an embodiment of the invention, the material is made of boron having a percentage in a range of about 1 to about 5, cobalt having a percentage in a range of about 75 to about 90, iron having a percentage in a range of about 7 to about 30, nickel having a percentage in a range of about 1 to about 5, and silicon having a percentage in a range of about 7 to about 13.

In another embodiment of the invention, a method for operating an integrated circuit having a magnetic random access memory cell (e.g. a toggle mode magnetic random access memory cell) is provided. The method may include heating the free layer structure of the toggle mode magnetic random access memory, the free layer structure including at least two anti-parallel coupled ferromagnetic layers with at least one of the at least two anti-parallel coupled ferromagnetic layers being made of a material having a temperature dependent saturation magnetization moment, and applying a magnetic field generated by two subsequent and at least partially overlapping current pulses.

In yet another embodiment of the invention, a method for operating an integrated circuit having a magnetic random access memory cell (e.g. a toggle mode magnetic random access memory cell) is provided. The method may include heating the free layer structure of the toggle mode magnetic random access memory, the free layer structure including at least two anti-parallel coupled ferromagnetic layers with at least one of the at least two anti-parallel coupled ferromagnetic layers being made of a material having a temperature dependent intrinsic anisotropy field, and applying a magnetic field generated by two subsequent and at least partially overlapping current pulses.

In an embodiment of the invention, the non-magnetic tunnel barrier layer structure is a part of a current path to generate heat.

Furthermore, the method may further include providing a non-magnetic spacer layer arranged between the at least two anti-parallel coupled ferromagnetic layers and being a part of a current path to generate heat.

The material may have a relatively low Curie temperature.

In an embodiment of the invention, the material is made of a at least one material being selected from a group of materials consisting of boron, cobalt, iron, nickel, silicon, molybdenum, terbium, copper, platinum.

The boron may have a percentage in a range from about 1 to about 5.

The cobalt may have a percentage in a range from about 75 to about 90.

The iron may have a percentage in a range from about 7 to about 30.

The nickel may have a percentage in a range from about 1 to about 5.

The silicon may have a percentage in a range from about 7 to about 13.

In an embodiment of the invention, the material is made of boron having a percentage in a range of about 1 to about 5, cobalt having a percentage in a range of about 75 to about 90, iron having a percentage in a range of about 7 to about 30, nickel having a percentage in a range of about 1 to about 5, and silicon having a percentage in a range of about 7 to about 13.

In yet another embodiment of the invention, a memory module is provided. The memory module may include a plurality of integrated circuits, wherein at least one integrated circuit of the plurality of integrated circuits includes a magnetic random access memory cell (e.g. a toggle mode magnetic random access memory cell). The magnetic random access memory cell may include a reference layer structure being polarized in a first direction, a free layer structure including at least two anti-parallel coupled ferromagnetic layers and having an anisotropy in an axis parallel to the first direction, at least one of the at least two anti-parallel coupled ferromagnetic layers being made of a material having a temperature dependent saturation magnetization moment, and a non-magnetic tunnel barrier layer structure being disposed between the reference layer structure and the free layer structure.

In an embodiment of the invention, the memory module is a stackable memory module in which at least some of the integrated circuits are stacked one above the other.

In yet another embodiment of the invention, a memory module is provided. The memory module may include a plurality of integrated circuits, wherein at least one integrated circuit of the plurality of integrated circuits includes a magnetic random access memory cell (e.g. a toggle mode magnetic random access memory cell). The magnetic random access memory cell may include a reference layer structure being polarized in a first direction, a free layer structure including at least two anti-parallel coupled ferromagnetic layers and having an anisotropy in an axis parallel to the first direction; at least one of the at least two anti-parallel coupled ferromagnetic layers being made of a material having a temperature dependent intrinsic anisotropy field, and a non-magnetic tunnel barrier layer structure being disposed between the reference layer structure and the free layer structure.

In an embodiment of the invention, the memory module is a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit having magnetic random access memory cell, the magnetic random access memory cell comprising:
    a reference layer structure being polarized in a first direction;
    a free layer structure including at least two anti-parallel coupled ferromagnetic layers and having an anisotropy in an axis parallel to the first direction, at least one of the at least two anti-parallel coupled ferromagnetic layers being made of a material having a temperature dependent saturation magnetization moment; and
    a non-magnetic tunnel barrier layer structure being disposed between the reference layer structure and the free layer structure.

2. The integrated circuit of claim 1, wherein the non-magnetic tunnel barrier layer structure is a part of a current path to generate heat.

3. The integrated circuit of claim 1, further comprising a non-magnetic spacer layer arranged between the at least two anti-parallel coupled ferromagnetic layers and being a part of a current path to generate heat.

4. The integrated circuit of claim 1, wherein the material has a relatively low Curie temperature.

5. The integrated circuit of claim 1, wherein the material comprises at least one material selected from the group consisting of boron, cobalt, iron, nickel, silicon, molybdenum, terbium, copper, and platinum.

6. The integrated circuit of claim 5, wherein the material comprises boron, the boron having a percentage in a range from about 1 to about 5.

7. The integrated circuit of claim 5, wherein the material comprises cobalt, the cobalt having a percentage in a range from about 75 to about 90.

8. The integrated circuit of claim 5, wherein the material comprises iron, the iron having a percentage in a range from about 7 to about 30.

9. The integrated circuit of claim 5, wherein the material comprises nickel, the nickel having a percentage in a range from about 1 to about 5.

10. The integrated circuit of claim 5, wherein the material comprises silicon, the silicon having a percentage in a range from about 7 to about 13.

11. The integrated circuit of claim 1, wherein the material comprises:
    boron having a percentage in a range of about 1 to about 5;
    cobalt having a percentage in a range of about 75 to about 90;
    iron having a percentage in a range of about 7 to about 30;
    nickel having a percentage in a range of about 1 to about 5; and
    silicon having a percentage in a range of about 7 to about 13.

12. An integrated circuit having a magnetic random access memory cell, the magnetic random access memory cell comprising:
    a reference layer structure being polarized in a first direction;
    a free layer structure including at least two anti-parallel coupled ferromagnetic layers and having an anisotropy in an axis parallel to the first direction; at least one of the at least two anti-parallel coupled ferromagnetic layers being made of a material having a temperature dependent intrinsic anisotropy field; and
    a non-magnetic tunnel barrier layer structure being disposed between the reference layer structure and the free layer structure.

13. A method of operating an integrated circuit having a magnetic random access memory cell, the method comprising:
    heating a free layer structure of the magnetic random access memory, the free layer structure including at least two anti-parallel coupled ferromagnetic layers with at least one of the at least two anti-parallel coupled ferromagnetic layers being made of a material having a temperature dependent saturation magnetization moment; and
    applying a magnetic field generated by two subsequent and at least partially overlapping current pulses.

14. The method of claim 13, wherein the non-magnetic tunnel barrier layer structure is a part of a current path to generate heat.

15. The method of claim 13, further comprising providing a non-magnetic spacer layer arranged between the at least two anti-parallel coupled ferromagnetic layers and being a part of a current path to generate heat.

16. The method of claim 13, wherein the material has a relatively low Curie temperature.

17. The method of claim 13, wherein the material comprises at least one material being selected from the group of materials consisting of boron, cobalt, iron, nickel, silicon, molybdenum, terbium, copper, and platinum.

18. The method of claim 17, wherein the material comprises boron, the boron having a percentage in a range from about 1 to about 5.

19. The method of claim 17, wherein the material comprises cobalt, the cobalt having a percentage in a range from about 75 to about 90.

20. The method of claim 17, wherein the material comprises iron, the iron having a percentage in a range from about 7 to about 30.

21. The method of claim 17, wherein the material comprises nickel, the nickel having a percentage in a range from about 1 to about 5.

22. The method of claim 17, wherein the material comprises silicon, the silicon having a percentage in a range from about 7 to about 13.

23. The method of claim 13, wherein the material comprises:
    boron having a percentage in a range of about 1 to about 5;
    cobalt having a percentage in a range of about 75 to about 90;
    iron having a percentage in a range of about 7 to about 30;
    nickel having a percentage in a range of about 1 to about 5; and
    silicon having a percentage in a range of about 7 to about 13.

24. A method for operating an integrated circuit having a magnetic random access memory cell, the method comprising:
    heating a free layer structure of the magnetic random access memory cell, the free layer structure including at least two anti-parallel coupled ferromagnetic layers with at least one of the at least two anti-parallel coupled ferromagnetic layers being made of a material having a temperature dependent intrinsic anisotropy field; and
    applying a magnetic field generated by two subsequent and at least partially overlapping current pulses.

25. A memory module, comprising:
    a plurality of integrated circuits, wherein at least one integrated circuit of the plurality of integrated circuits comprises a magnetic random access memory cell, the magnetic random access memory cell comprising:
    a reference layer structure being polarized in a first direction;
    a free layer structure including at least two anti-parallel coupled ferromagnetic layers and having an anisotropy in an axis parallel to the first direction, at least one of the at least two anti-parallel coupled ferromagnetic layers being made of a material having a temperature dependent saturation magnetization moment; and
    a non-magnetic tunnel barrier layer structure being disposed between the reference layer structure and the free layer structure.

* * * * *